(12) United States Patent
Muraoka

(10) Patent No.: US 8,860,527 B2
(45) Date of Patent: Oct. 14, 2014

(54) EQUALIZER CIRCUIT AND PRINTED CIRCUIT BOARD

(75) Inventor: Satoshi Muraoka, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 264 days.

(21) Appl. No.: 13/354,436

(22) Filed: Jan. 20, 2012

(65) Prior Publication Data

US 2012/0194304 A1  Aug. 2, 2012

(30) Foreign Application Priority Data

Jan. 28, 2011  (JP) ................................. 2011-016121

(51) Int. Cl.
*H04B 3/04* (2006.01)
*H04L 25/03* (2006.01)

(52) U.S. Cl.
CPC ............ *H04L 25/03878* (2013.01); *H04B 3/04* (2013.01)
USPC ....................................................... 333/28 R

(58) Field of Classification Search
USPC ....................................................... 333/28 R
See application file for complete search history.

(56) References Cited

U.S. PATENT DOCUMENTS

| 7,457,132 B2 * | 11/2008 | Gisin et al. ..................... 361/782 |
| 2003/0193351 A1 | 10/2003 | Fukui |
| 2008/0310521 A1 | 12/2008 | Otsuka et al. |

FOREIGN PATENT DOCUMENTS

| EP | 1 359 668 A1 | 11/2003 |
| JP | 5-83164 A | 4/1993 |
| JP | 2003-309461 A | 10/2003 |
| JP | 2006-254303 A | 9/2006 |
| JP | 2008-294837 A | 12/2008 |

\* cited by examiner

*Primary Examiner* — Stephen Jones
(74) *Attorney, Agent, or Firm* — Crowell & Moring LLP

(57) ABSTRACT

An equalizer circuit includes a passive equalizer having an inductor connected in parallel to a signal interconnection line, the inductor being made up of a conductor portion formed on a side face of a through-hole of a circuit board.

20 Claims, 5 Drawing Sheets

EQUALIZER CIRCUIT AND PRINTED CIRCUIT BOARD

CLAIM OF PRIORITY

The present application claims priority from Japanese patent application JP 2011-016121 filed on Jan. 28, 2011, the content of which is hereby incorporated by reference into this application.

BACKGROUND OF THE INVENTION

1. Field of the Invention

The present invention relates to an equalizer circuit for interconnecting an electrical signal, and a printed circuit board installed with the equalizer circuit.

2. Background Art

In recent years, as the performance of electronic instruments increases, the signal interconnection speed between electronic components such as LSI (Large Scale Integration) circuits installed in an electronic instrument has been approximately doubling every three years. Particularly, in a backplane used in large-volume data processing equipment such as a server and a rooter, etc., it is predicted that an interconnection speed of more than 25 Gbps which means a limit of electrical interconnection will be demanded in about the year of 2012.

As the interconnection speed increases, the insertion loss in a printed board wiring increases resulting in an increase in the difference in group delay associated with the change of frequency. Such an insertion loss and the difference in group delay will increase jitter in the signal waveform. This may cause a shortening of the distance over which interconnection is possible or an increase of the bit error rate of interconnection information. Accordingly, it is necessary to smooth the frequency characteristics of the insertion loss and the group delay of the printed board wiring, thereby reducing jitter in the signal waveform.

JP Patent Publication (Kokai) No. 2003-309461 describes a technique for superimposing an emphasis signal for enhancing higher frequency components on a transmission signal. JP Patent Publication (Kokai) No. 5-83164 (1993) describes a technique for smoothing the frequency characteristic of a board wiring by equipping an equalizer circuit in the reception circuit.

JP Patent Publications (Kokai) No. 2006-254303 and No. 2008-294837 disclose a technique for smoothing the frequency characteristic of a printed board wiring by making up an equalizer circuit using passive components (a passive equalizer) to reduce power consumption.

SUMMARY OF THE INVENTION

The technique described in JP Patent Publication (Kokai) No. 2003-309461 requires addition of a circuit for performing a pre-emphasis processing to emphasize high frequency signals, and therefore power consumption increases for that part. Since the technique described in JP Patent Publication (Kokai) No. 5-83164 (1993) also requires addition of an equalizer circuit by means of an active circuit, power consumption will increase.

On the other hand, since the technique described in JP Patent Publications (Kokai) No. 2006-254303 and No. 2008-294837 is configured to smooth the frequency characteristic with a passive equalizer made up of passive components, power consumption can be reduced more easily than in the techniques described in JP Patent Publications (Kokai) No. 2003-309461 and No. 5-83164 (1993). In JP Patent Publication (Kokai) No. 2006-254303, an inductor and a resistor are connected to the terminal end of an interconnection line to smooth the characteristic of the interconnection line with the frequency characteristic of the inductor. In JP Patent Publication (Kokai) No. 2008-294837, an equalizer circuit made up of a capacitor, a resistor, and an inductor is disposed in a driver for outputting a signal to an interconnection line, thereby smoothing the characteristic of the interconnection line.

However, in the technique described in JP Patent Publications (Kokai) No. 2006-254303 and No. 2008-294837, it is required to change the inductor value and the like in accordance with the characteristic of the entire interconnection path. Since the characteristic of the entire interconnection path changes when the wiring length or board material changes, it is necessary to change components to be mounted in order to change the value of the inductor of the passive equalizer.

The present invention has been made to solve the above described problems, and provides a low power consumption equalizer circuit, which can smooth the frequency characteristic of circuit in accordance with the characteristic of the interconnection path without changing components to be mounted for each circuit.

The equalizer circuit according to the present invention includes a passive equalizer having an inductor connected in parallel to a signal interconnection line, wherein the inductor is made up of a conductor portion formed on the side face of a through-hole of the circuit board.

These and other objects, features and advantages of the invention will be apparent from the following more particular description of preferred embodiments of the invention, as illustrated in the accompanying drawings.

DETAILED DESCRIPTION OF THE PREFERRED EMBODIMENTS

Hereafter, embodiments of the present invention will be described in detail based on the drawings. It is noted that in all the drawings to describe the embodiments, the like members are given the like reference symbols, and repetitive description thereof will be omitted.

<Embodiment 1>

Figure 1:
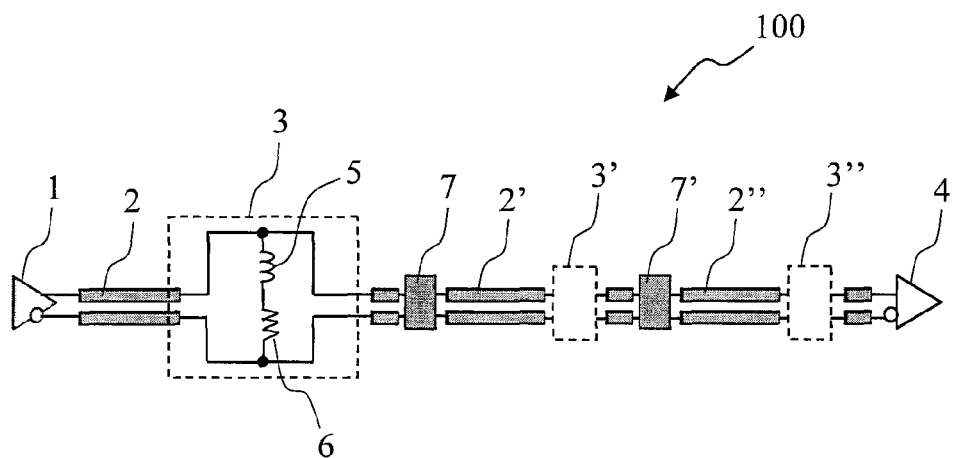
FIG. 1 is a circuit configuration diagram of an equalizer circuit 100 according to Embodiment 1.

FIG. 1 is a circuit configuration diagram of an equalizer circuit 100 according to Embodiment 1 of the present invention. The equalizer circuit 100 includes a LSI driver 1, a signal line 2, a passive equalizer 3, a connector 7, and a LSI receiver 4. It is also possible to further provide a similar wiring structure between the connector 7 and the LSI receiver 4 depending on the distance between the LSI driver 1 and the LSI receiver 4. FIG. 1 shows an example in which a signal line 2', a passive equalizer 3', a connector 7', a signal line 2", and a passive equalizer 3" are provided.

The LSI driver 1 transmits an electrical signal to the LSI receiver 4. The signal line 2 is a differential interconnection line for interconnecting an electrical signal, and has an insertion loss characteristic and a group delay characteristic according to its material and length, etc. The passive equalizer 3 smoothes the insertion loss characteristic and the group delay characteristic of the signal line 2 with respect to signal frequency. The connector 7 connects the signal line 2 with the passive equalizer 3.

The passive equalizer 3 includes an inductor 5 and a resistor 6. The inductance of the inductor 5 and the resistance value of the resistor 6 are designed to smooth the interconnection characteristic of the signal line 2 with respect to signal frequency. Similarly, the passive equalizer 3' is designed to smooth the interconnection characteristic of the signal line 2', and the passive equalizer 3" is designed to smooth the interconnection characteristic of the signal line 2".

Since the passive equalizer 3 is made up by using passive components (here, the inductor 5 and the resistor 6) which do not actively operate, it has an advantage that its power consumption is less than that of an active equalizer. However, since it does not operate actively, it is necessary to adjust in advance the circuit characteristic of the passive equalizer 3 in accordance with the frequency characteristic of the signal line 2 in order to achieve a satisfactory effect of smoothing the frequency characteristic of the signal line 2.

Generally, since the characteristics of the electronic components making up the passive equalizer 3 are constant, it is necessary to mount electronic components in accordance with the characteristic of each individual signal line 2, and therefore electronic components need to be replaced separately for each characteristic of the signal line 2. Accordingly, the present invention attempts to form an inductor utilizing a through-hole formed in the circuit board to enable the adjustment of the circuit characteristic of the passive equalizer 3.

Figure 2:
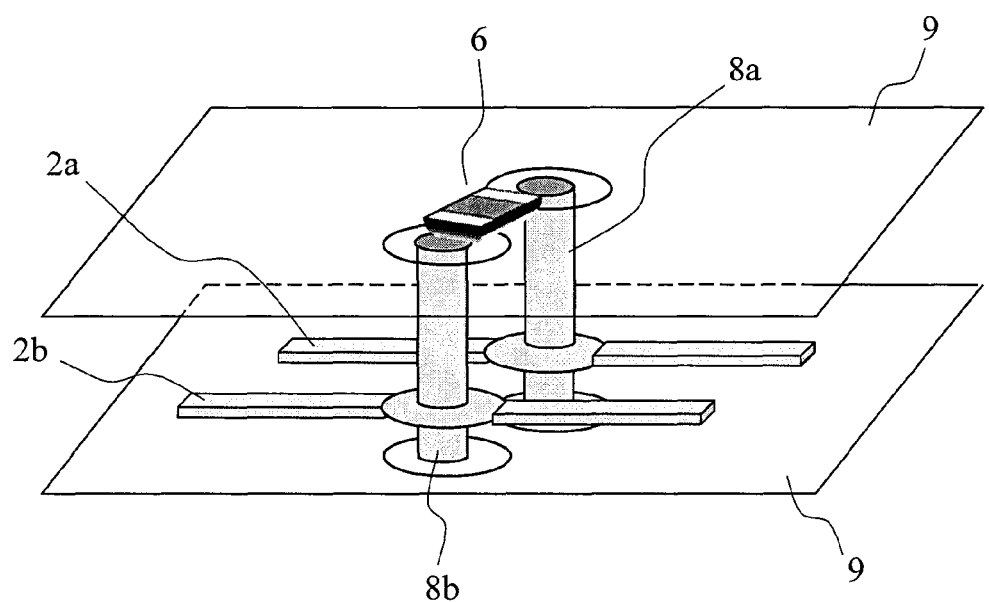
FIG. 2 is a perspective view of a passive equalizer 3.

FIG. 2 is a perspective view of the passive equalizer 3. The signal line 2 includes a positive side signal line 2a and a negative side signal line 2b, and is installed on a printed circuit board 9. The printed circuit board 9 has a multi-layer structure, and the signal line 2 is installed in any one of the layers. A pair of through-holes 8 (8a and 8b) are provided between layers of the printed circuit board 9.

The through-hole 8 penetrates between layers of the printed circuit board 9. A conductor portion is provided on the side face of the through-hole 8, and the conductor portion is electrically connected to the signal lines 2a and 2b, respectively. The resistor 6 is electrically connected with the conductor portions of the respective through-holes 8a and 8b.

The conductor portion formed on the side face of the through-hole 8 has an inductance, and this inductance functions as the inductor 5 shown in FIG. 1. Connecting the through-holes 8a and 8b with the resistor 6 enables to make up a passive equalizer 3 which connects between the signal lines 2a and 2b.

To adjust the function of the passive equalizer 3 to smooth the frequency characteristic of the signal line 2, it is necessary to adjust the inductance of the inductor 5. Specifically, the length of the through-hole 8 is adjusted. It may be configured such that when the equalizer circuit 100 is installed on the printed circuit board 9, the through-hole 8 is formed into a length that makes it possible to obtain a desired inductance, and the resistor 6 is connected between the through-holes 8a and 8b.

It is noted that in an actual printed circuit board 9, there may be cases in which the location in the depth direction for installing the resistor 6 is limited. In this case, the range in which the inductance of the inductor 5 can be adjusted will be limited.

Figure 3:
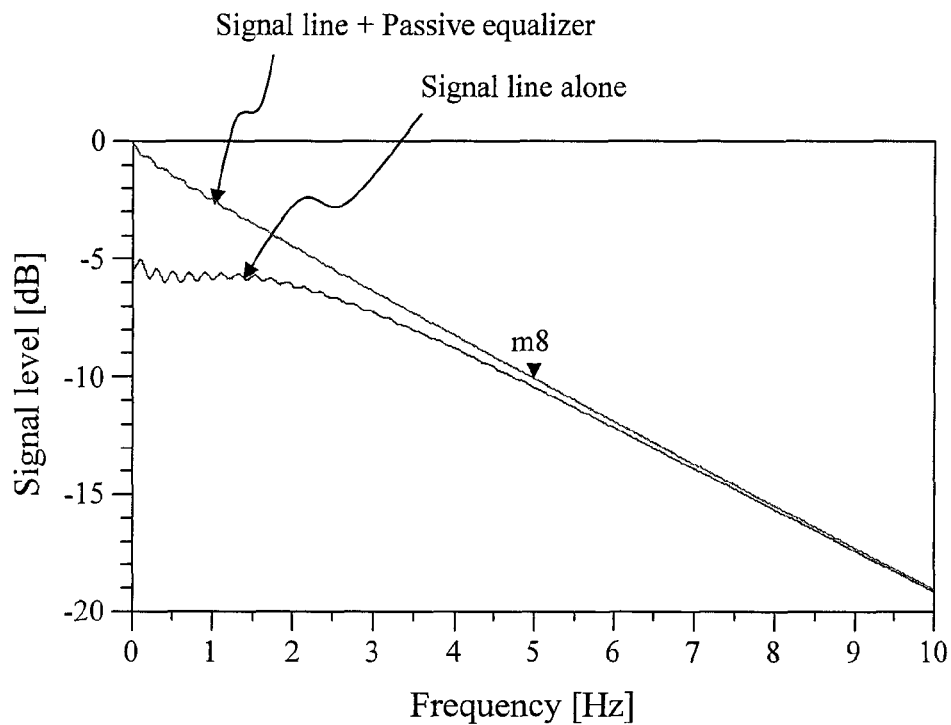
FIG. 3 is a graph to show the frequency characteristic of insertion loss of the equalizer circuit 100.

FIG. 3 is a graph to show the frequency characteristic of insertion loss of the equalizer circuit 100. Here, it is supposed that the diameter of the through-hole 8 is 0.1 mm, the length of the through-hole is 3 mm, and the inductance of the inductor 5 is 1.5 nH. The resistor 6 is supposed to have a value of 180Ω.

As shown in FIG. 3, the insertion loss of the signal line 2 has a characteristic in which the signal amplitude decreases as the frequency increases. It is seen that when the passive equalizer 3 according to the present Embodiment 1 is disposed, the characteristic of the signal amplitude with respect to frequency becomes close to a fixed value, especially in a lower frequency region, thus exhibiting the effect of smoothing the frequency characteristic of insertion loss.

Figure 4:
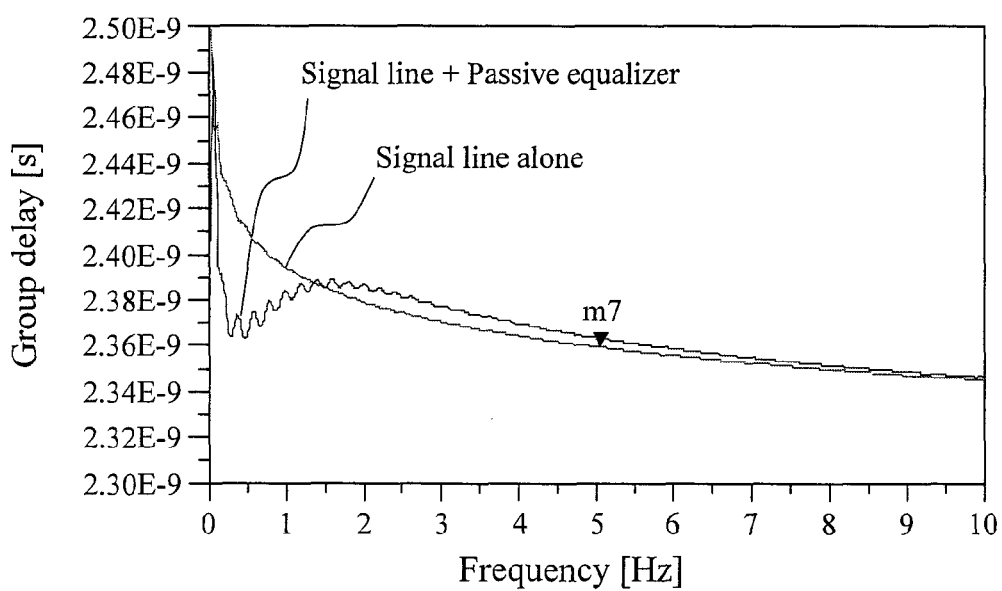
FIG. 4 is a graph to show the frequency characteristic of group delay of the equalizer circuit 100.

FIG. 4 is a graph to show the frequency characteristic of the group delay of the equalizer circuit 100. As shown in FIG. 4, the group delay of the signal line 2 has a characteristic in which the delay time decreases as the frequency increases. It is seen that when the passive equalizer 3 according to the present Embodiment 1 is disposed, the characteristic of group delay with respect to frequency becomes close to a fixed value, especially in a lower frequency region, thus exhibiting the effect of smoothing the frequency characteristic of group delay.

Figure 5A:
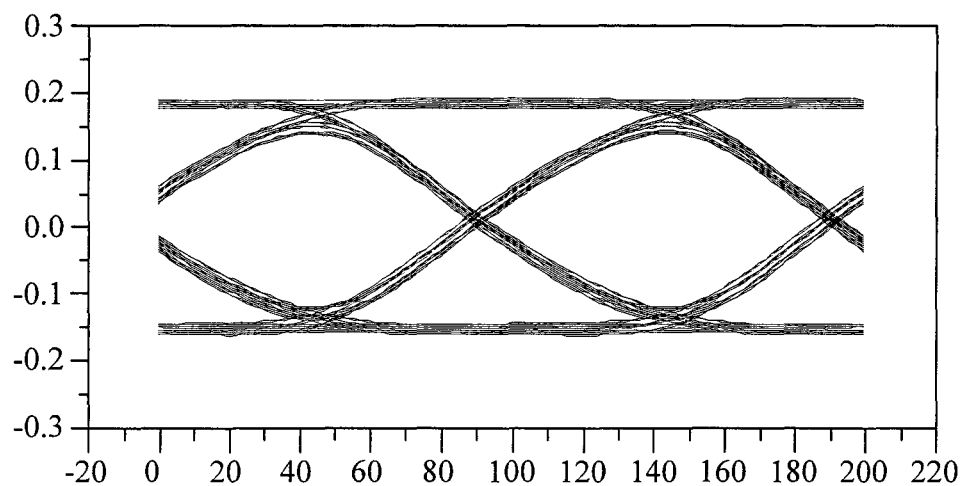
FIGS. 5A and 5B are graphs to show an eye pattern of reception waveform at a LSI receiver 4.
Figure 5B:
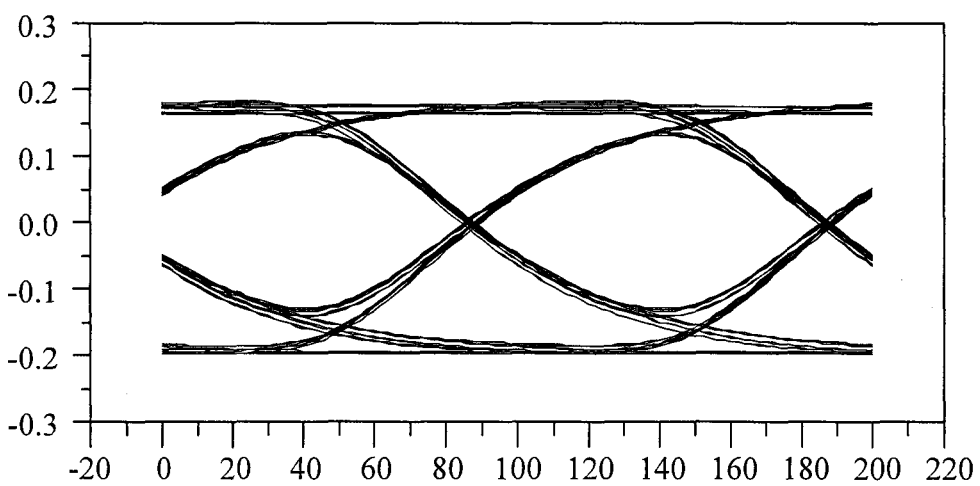

FIG. 5 is a graph to show an eye pattern of reception waveform at the LSI receiver 4. FIG. 5A shows a reception waveform when pre-emphasis is applied to the output signal of the LSI driver 1 without using any passive equalizer 3, 3', or 3". FIG. 5B shows a reception waveform when a passive equalizer 3, 3', or 3" are used without performing pre-emphasis processing.

Comparing FIGS. 5A and 5B, the eye opening width is equally good for either of the reception waveforms indicating that a good signal waveform is obtained.

<Embodiment 1: Summary>

As described so far, the equalizer circuit 100 according to the present Embodiment 1 includes the passive equalizer 3 which is connected in parallel to the signal line 2, and the inductor 5 of the passive equalizer 3 is made up by using a conductor portion formed on the side face of the through-hole 8 which penetrates the printed circuit board 9. By adjusting the length of the through-hole 8, it is possible to adjust the inductance of the inductor 5 in accordance with the characteristic of the signal line 2. This eliminates the need of replacing the components of the passive equalizer 3 for each characteristic of the signal line 2, which is advantageous in terms of the flexibility in configuration, manufacturing period, cost, and the like.

<Embodiment 2>

Figure 6:
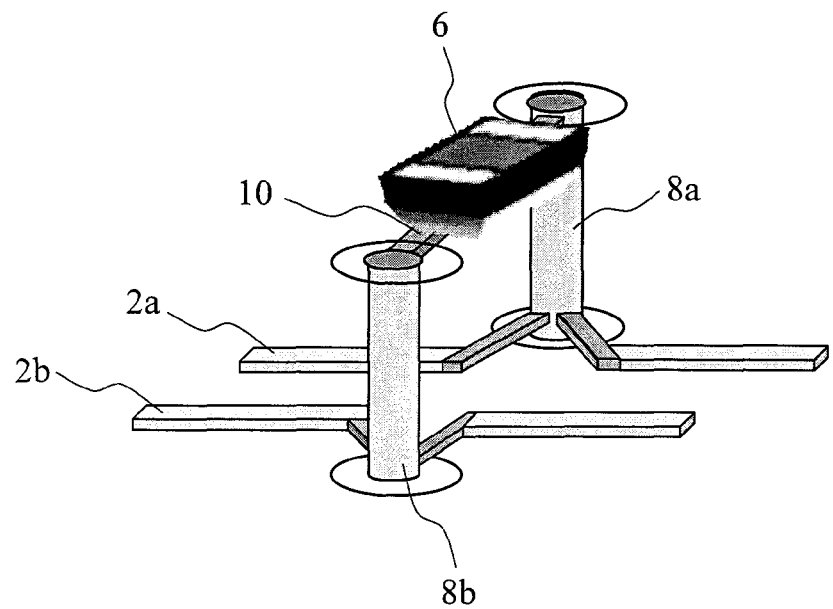
FIG. 6 is a perspective view of a passive equalizer 3 equipped in the equalizer circuit 100 according to Embodiment 2.

FIG. 6 is a perspective view of the passive equalizer 3 included in the equalizer circuit 100 according to Embodiment 2 of the present invention. Since the configuration of the passive equalizer 3 is similar to that of Embodiment 1 excepting the peripheral configuration thereof, hereafter, the configuration shown in FIG. 6 will be mainly described.

The size of the resistor 6 which is a chip component, may generally be larger than the disposition spacing of the signal line 2. Therefore, the spacing between the through-hole 8a and the through-hole 8b, between which the resistor 6 is connected, will be smaller than the spacing between the signal lines 2a and 2b. Accordingly, in the present Embodiment 2, a wiring pattern connecting between the signal line 2 and the through-hole 8 is provided.

In the example shown in FIG. 6, the through-hole 8 is provided at a position which is apart from each signal line and at which it does not to intersect at right angles with the signal lines 2a and 2b.

When the through-hole 8 is provided at a position apart from the signal line 2, it is necessary to electrically connect the position where the through-hole is provided, with the signal line 2 to constitute an equivalent circuit to that of FIG. 1. Accordingly, in the present Embodiment 2, the signal line 2 is diverted from its advancing direction in the vicinity of the through-hole 8 to be brought into contact with a conductor portion provided on the side face of the through-hole 8.

It is noted that since providing the through-hole 8 at a position apart from the signal line 2 results in a larger spacing between the through-holes 8a and 8b, it is necessary to provide an electric wiring 10 as needed to connect between the conductor portions of the side face of the through-holes 8. The resistor 6 may be installed on the electric wiring 10.

It is also conceivable to configure that an electric wiring is drawn out from the signal line 2 to be connected to the conductor portion of the through-hole 8 without diverting the advancing direction of the signal line 2. However, in this case, since the path of the signal line 2 is branched, the signal characteristic is more prone to deteriorate. Therefore, it is desirable to configure as shown in FIG. 6 without branching off the signal line 2.

<Embodiment 2: Summary>

As so far described, in the equalizer circuit 100 according to the present Embodiment 2, the through-hole 8 is provided at a position which is apart from the extension line of the signal line 2 and where it does not intersect at right angles with the signal line 2, and the signal line 2 is configured to be diverted from its advancing direction in the vicinity of the through-hole 8 and to be brought into contact with the conductor portion. By this configuration, even when the size of the resistor 6 which is a chip component is larger than the disposition spacing of the signal line 2, it is possible to make up an equivalent circuit to that of FIG. 1.

<Embodiment 3>

Figure 7:
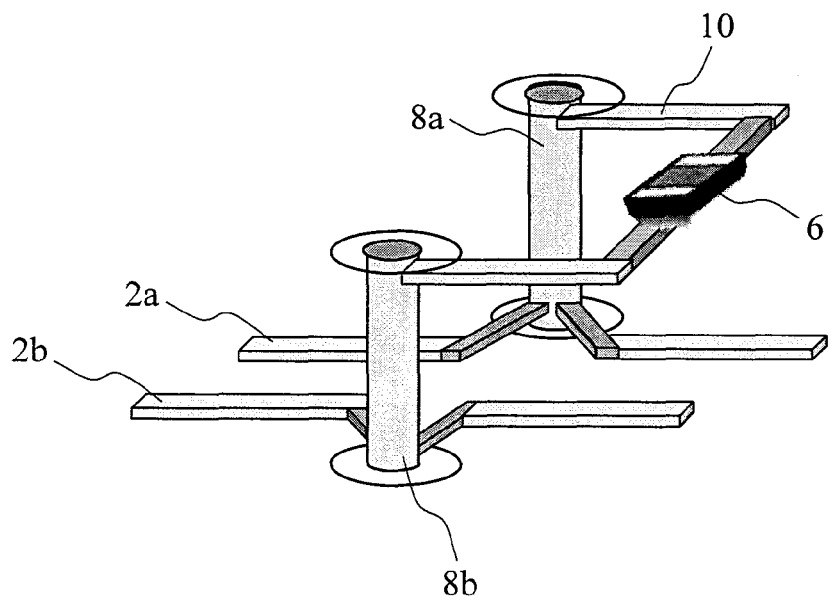
FIG. 7 is a perspective view of a passive equalizer 3 equipped in the equalizer circuit 100 according to Embodiment 3.

FIG. 7 is a perspective view of the passive equalizer 3 included in the equalizer circuit 100 according to Embodiment 3 of the present invention. Since the configuration of the passive equalizer 3 is similar to that of Embodiment 1 excepting the peripheral configuration thereof, hereafter, the configuration shown in FIG. 7 will be mainly described.

In FIG. 6 which is described regarding Embodiment 2, it is described that the through-holes 8a and 8b are connected by the electric wiring 10. While this electric wiring 10 in principle connects between the through-holes 8a and 8b in a linear fashion, a bypass wiring as shown in FIG. 7 may be adopted as needed. In this case, the length of the electric wiring 10 becomes longer than that in FIG. 6 and, as a result, the electric wiring 10 itself forms a significant inductance together with the conductor portion of the through-hole 8 as well.

Accordingly, when the length of the through-hole 8 is not sufficient, the electric wiring 10 may be formed to be longer than that in FIG. 6 by extending the electric wiring 10 in a direction not parallel with the axial direction of the through-hole 8, in a plane in which the resistor 6 is installed. This allows that even when the inductance of the through-hole 8 is insufficient, it can be supplemented by the inductance formed by the electric wiring 10.

Further, when other electronic components and structures are disposed on the straight line connecting the terminal end portions of the through-holes 8a and 8b, a bypass wiring may be provided as shown in FIG. 7.

<Embodiment 4>

In Embodiments 1 to 3, it is described that a conductor portion is provided on the side face of the through-hole 8, and the inductor 5 is formed with the conductor portion. Further, in Embodiment 3, it is described that the inductance component of the electric wiring 10 is utilized.

When the inductance is still not sufficient, a magnetic body such as Ni and Cr etc. may be disposed on the side face of the through-hole 8 in the configuration described in Embodiments 1 to 3. This is because disposing a magnetic body increases the inductance of the through-hole 8.

To be specific, for example, a magnetic body can be applied to the conductor portion on the side face of the through-hole 8 thereby increasing the inductance component of the through-hole 8. Alternatively, a magnetic body coating may be formed by such as plating only on the surface of the side face portion of the through-hole 8 to provide a conductor portion in the inner side (a portion near the central axis of the through-hole 8) of the magnetic body.

<Embodiment 5>

In Embodiments 1 to 4 described so far, the following are contemplated as a specific implementation of the resistor 6.

(Example 1 of the resistor 6)

A chip resistor (surface mount chip component) which is to be mounted onto the surface of the printed circuit board 9 can be used as the resistor 6.

(Example 2 of the resistor 6)

There are some types of printed circuit boards 9 in which electronic components can be embedded. A resistance element which is configured as an embedded component of on-board built-in type may be used as the resistor 6.

(Example 3 of the resistor 6)

When the printed circuit board 9 needs to be formed into a thin shape, a resistance element having a large thickness cannot be used. In such a case, a resistance element having a sheet shape may be used as the resistor 6. That is because, to adjust the characteristic of the passive equalizer 3, the inductor 5 plays an important role and the accuracy of the resistor 6 is not so important compared to that of the inductor 5.

<Embodiment 6>

Figure 8:
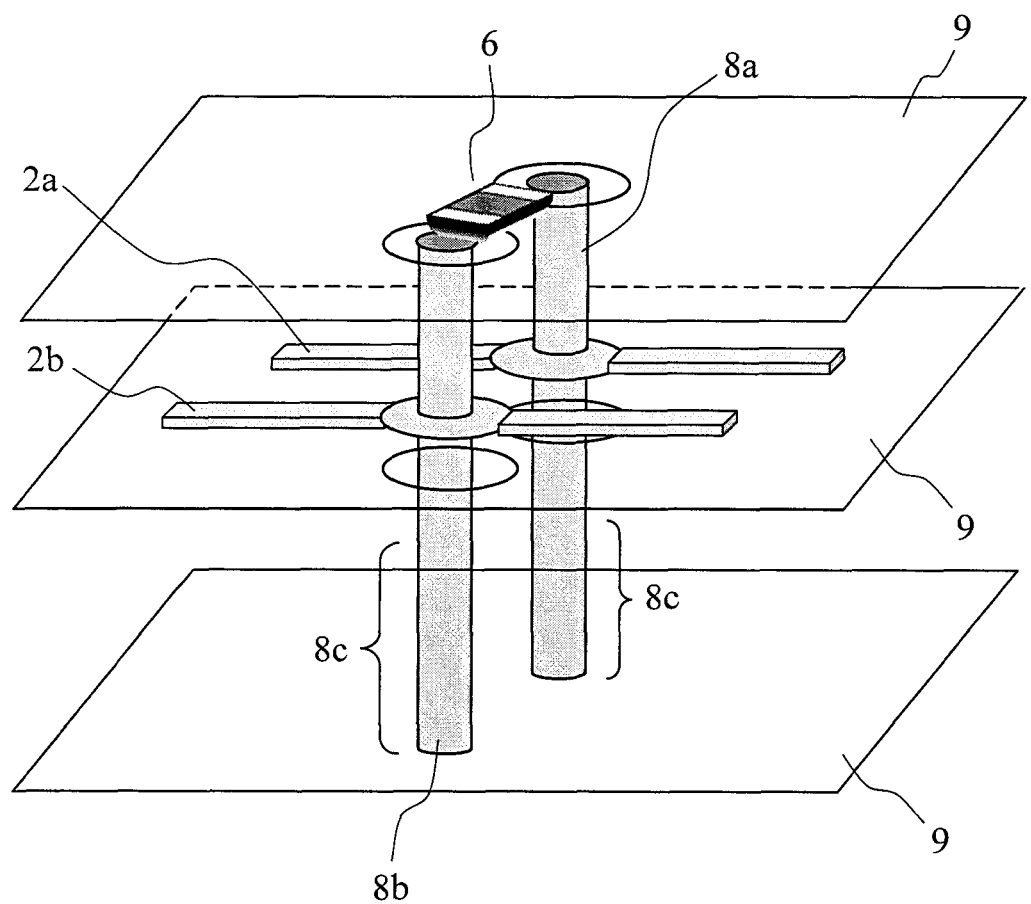
FIG. 8 is a diagram to explain appropriate length of a through-hole 8.

FIG. 8 explains an appropriate length of the through-hole 8. When forming a through-hole 8 and a conductor portion on the side face thereof in a printed circuit board 9, it would be general that such processing is performed so as to penetrate the printed circuit board 9. In that case, the length of the through-hole 8 may become unnecessarily large. This corresponds to an unwanted portion 8c shown in FIG. 8.

In such a case, it is desirable to remove the unwanted portion 8c by applying processing such as back drilling from the surface opposite to the side where the signal line 2 and the resistor 6 are installed. This is because a desired inductance may not be obtained if the unwanted portion 8c remains. The method of removing the unwanted portion 8c can be used in Embodiments 1 to 5 as well.

<Embodiment 7>

In Embodiments 1 to 6 described above, although description has been made on the case where the signal line 2 is a differential interconnection line, even when the signal line 2 is made up of one signal line, a similar configuration may be adopted to exhibit a similar effect. In this case, one end of the passive equalizer 3 is connected to the signal line 2, and the other end is connected to GND.

As described so far, the invention made by the present inventors has been concretely described based on embodiments thereof, it is without saying that the present invention will not be limited to the above described embodiments and can be modified in various ways within a range not departing from the gist thereof.

According to the equalizer circuit according to the present invention, by smoothing the frequency characteristic of signal interconnection line by using a passive equalizer, it is possible to suppress power consumption. Moreover, since the inductance of the passive equalizer can be adjusted by adjusting the length of a through-hole to be formed, it is possible to smooth the frequency characteristic of the circuit in accordance with the characteristic of the interconnection path without changing components to be mounted for each circuit.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

DESCRIPTION OF SYMBOLS

| | | |
|---|---|---|
| 1: LSI driver, | 2: signal line, | 3: passive equalizer, |
| 4: LSI receiver, | 5: inductor, | 6: resistor |
| 7: connector, | 8: through-hole, | 9: printed circuit board |
| 10: electric wiring, | 100: equalizer circuit | |

What is claimed is:

1. An equalizer circuit comprising:
   a signal interconnection line for interconnecting an electrical signal; and
   a passive equalizer for smoothing a frequency characteristic of the signal interconnection line, wherein
   the passive equalizer includes an inductor and a resistance element which are connected in parallel to the signal interconnection line,
   the inductor is made up by a conductor portion which is formed in a side face of a through-hole included in a circuit board on which the signal interconnection line is installed, and
   at least one of a length of the through-hole or a diameter of the through-hole is configured to determined and inductance of the inductor and smooth the frequency characteristic of the signal interconnection line.

2. The equalizer circuit according to claim 1, wherein
   the signal interconnection line is formed as a differential interconnection line, and
   the passive equalizer is configured to connect a positive-side interconnection line and a negative-side interconnection line of the differential interconnection line.

3. The equalizer circuit according to claim 1, wherein
   the through-hole penetrates the circuit board at a position at which the through-hole does not directly intersect with the signal interconnection line, and
   the signal interconnection line is configured to be diverted from its wiring direction in the vicinity of the conductor portion, and to be brought into contact with the conductor portion.

4. A printed circuit board, wherein the equalizer circuit according to claim 3 is equipped.

5. The equalizer circuit according to claim 1, wherein
   the resistance element is configured as a surface mount chip component.

6. A printed circuit board, wherein the equalizer circuit according to claim 5 is equipped.

7. The equalizer circuit according to claim 1, wherein
   the resistance element is configured as a built-in component that is embedded within the circuit board.

8. A printed circuit board, wherein the equalizer circuit according to claim 7 is equipped.

9. The equalizer circuit according to claim 1, wherein
   the resistance element is configured to be a sheet-type resistance component.

10. A printed circuit board, wherein the equalizer circuit according to claim 9 is equipped.

11. A printed circuit board, wherein
    the equalizer circuit according to claim 1 is equipped.

12. The printed circuit board according to claim 11, wherein
    the printed circuit board has a plurality of layers, and
    the through-hole is formed only between a layer where the resistance element is equipped and a layer where the signal interconnection line is equipped.

13. The equalizer circuit according to claim 1, wherein
    the resistance element is connected with the conductor portion via an electric wiring and a pad.

14. A printed circuit board, wherein the equalizer circuit according to claim 13 is equipped.

15. The equalizer circuit according to claim 13, wherein
    the electric wiring is formed by being extended in a direction nonparallel with the axial direction of the through-hole in a plane of the circuit board where the resistance element is implemented.

16. A printed circuit board, wherein the equalizer circuit according to claim 15 is equipped.

17. The equalizer circuit according to claim 1, wherein
    the through-hole is formed with a magnetic body disposed in its side face.

18. A printed circuit board, wherein the equalizer circuit according to claim 17 is equipped.

19. The equalizer circuit according to claim 17, wherein
    the through-hole is formed such that the surface of the conductor portion is coated with a magnetic body.

20. A printed circuit board, wherein the equalizer circuit according to claim 19 is equipped.

* * * * *